United States Patent [19]

Welland et al.

[11] Patent Number: 4,709,225

[45] Date of Patent: Nov. 24, 1987

[54] SELF-CALIBRATION METHOD FOR CAPACITORS IN A MONOLITHIC INTEGRATED CIRCUIT

[75] Inventors: David R. Welland; Michael J. Callahan, both of Austin, Tex.

[73] Assignee: Crystal Semiconductor Corporation, Austin, Tex.

[21] Appl. No.: 809,530

[22] Filed: Dec. 16, 1985

[51] Int. Cl.$^4$ .............................................. H03M 1/10
[52] U.S. Cl. ....................... 340/347 CC; 340/347 AD
[58] Field of Search ................... 340/347 CC, 347 AD, 340/347 DA

[56] References Cited

U.S. PATENT DOCUMENTS 4,399,426  8/1983  Tan ................................ 340/347 CC

FOREIGN PATENT DOCUMENTS 0134546  10/1979  Japan ........................... 340/347 DA

OTHER PUBLICATIONS

Yee, "IBM Technical Disclosure Bulletin", vol. 19, No. 6, Nov. 1976, pp. 2360-2362.

Primary Examiner—Charles D. Miller
Attorney, Agent, or Firm—Leonard & Lott

[57] ABSTRACT

A method for adjusting capacitances in a monolithic integrated circuit wherein it is desirable that the capacitances form a binarily-weighted sequence of values includes sequentially-connecting trim capacitors in parallel with a primary capacitor and determining as each trim capacitor is connected, whether the resultant parallel capacitance is larger or smaller than that of a reference capacitance. If the resultant capacitance is too large, the trim capacitor is disconnected, but otherwise is left connected. The process is repeated until each trim capacitor has been tried. For the purpose of adjusting the capacitance of the next-largest capacitance, the final resultant capacitance is connected in parallel with the reference capacitance to form a new reference capacitance. The procedure is then repeated with the next-largest primary capacitor until the final resultant capacitance associated with each primary capacitor has been adjusted. In another aspect of the invention, capacitance-adjustment steps are sequentially interleaved with analog-to-digital conversions in an analog-to-digital converter.

4 Claims, 7 Drawing Figures

SELF-CALIBRATION METHOD FOR CAPACITORS IN A MONOLITHIC INTEGRATED CIRCUIT

TECHNICAL FIELD

The present invention relates generally to electronic circuits and, more particularly, is concerned with a method for providing a calibrated array of binarily-weighted capacitance values in a monolithic integrated circuit.

BACKGROUND OF THE INVENTION

Analog-to-digital converters of the successive-approximation type generally include a binarily-weighted array of precision resistor or capacitor components. Ideally, in such a binarily-weighted array, each member of the array will have a resistance or capacitance value of exactly one half that of another member of the array. In analog to digital converters having more than 14 bits, it has heretofore been difficult and expensive to achieve the extremely-precise component accuracy required.

One method which has been utilized to provide such an array of components for use in conjunction with an analog-to-digital converter is the laser trimming of nichrome resistors. Regardless, though, of how accurately the binarily-weighted components may initially be fabricated, conversion errors invariably arise due to temperature-induced changes and long-term drift of component values. Consequently, it is desirable that the array of component values be calibrated from time to time. Analog-to-digital converters that can be calibrated subsequent to initial manufacture and without the use of external components are referred to as self-calibrating circuits. To satisfy size, reliability, and economic requirements, it is desirable that such a self-calibrating circuit utilize only components that are suitable for fabrication in a monolithic integrated circuit with presently-existing process technology.

One self-calibrating circuit which has been proposed utilizes an array of MOS capacitors initially manufactured as closely as possible to ideal binarily-weighted values. The proposed circuit can be implemented using standard CMOS or NMOS technology. During calibration, errors in capacitance values are measured and stored in a memory as digital codes. These digital codes are arithmetically manipulated and utilized to generate an analog voltage which is utilized by the digital to analog converter to correct for the known error. The proposed circuit is rather complex and the process of generating an analog voltage and utilizing it to correct for the known error may itself not be free of error.

Accordingly, a need exists for a method for adjusting the values of a plurality of capacitances in a monolithic integrated circuit so that the plurality of capacitances form a highly accurate binarily-weighted sequence of values. It is further desirable that such method be capable of being repeated from time to time in order to continuously calibrate the array of capacitance values.

In another aspect of the invention, it is desirable that a self-calibrating procedure for a binarily-weighted array of capacitances in an analog-to-digital converter be continuously performed and be transparent to the user of the analog-to-digital converter.

SUMMARY OF THE INVENTION

The present invention provides a method for self-calibration of capacitances for a binarily-weighted array of capacitances. The method is utilized in conjunction with circuitry that can readily and economically be fabricated with present MOS processing technology for implementation into a monolithic integrated circuit. The self-calibrating method is a multi-step procedure that can be continuously performed in an interleaved manner with other circuit operations such as conversion operations of an analog-to-digital converter.

DETAILED DESCRIPTION OF A PREFERRED EMBODIMENT

Figures 1A, 1B:
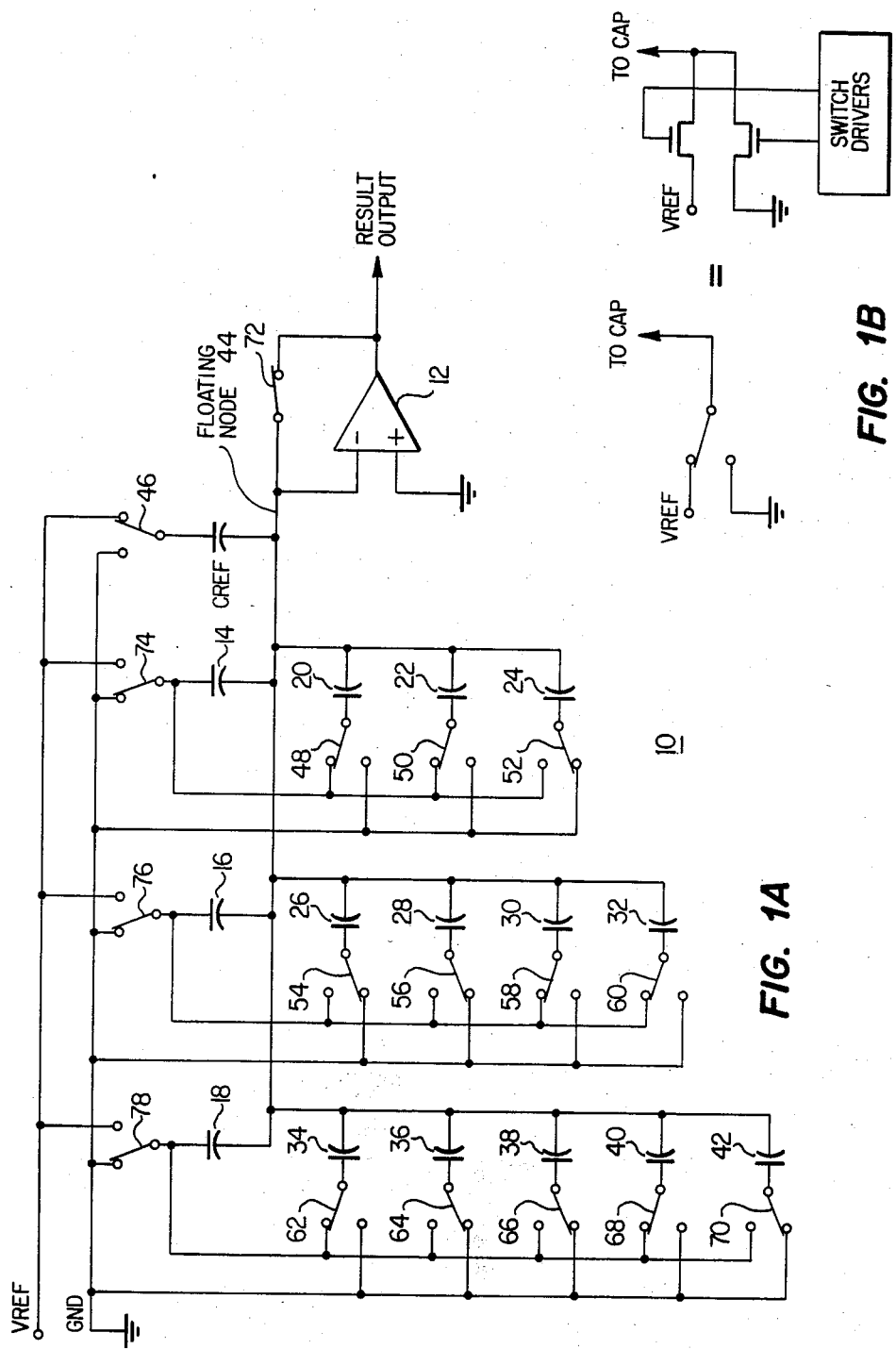
FIG. 1A is an electrical schematic diagram illustrating circuitry which may be utilized to form a binarily-weighted sequence of capacitance values in accordance with the present invention.
FIG. 1B is an electrical schematic diagram illustrating an MOS transistor implementation of the switches of FIG. 1A.

Referring now to FIG. 1A, circuitry which may be utilized to form a binarily-weighted sequence of capacitance values in accordance with methods of the present invention is illustrated. The circuitry of FIG. 1A is indicated generally by the reference numeral 10. The circuit 10 includes a voltage comparator 12, a reference capacitor designated as CREF, a set of primary capacitors comprised of capacitors 14, 16 and 18, a first set of trim capacitors comprising capacitors 20, 22 and 24, a second set of trim capacitors comprising capacitors 26, 28, 30 and 32, and a third set of trim capacitors comprising capacitors 34, 36, 38, 40, and 42.

One terminal of each of the capacitors in the circuit 10 is connected to a floating node 44. The reference capacitor CREF may be connected through a switch 46 either to a ground node (GND) or to a reference voltage VREF.

Each of the trim capacitors 20, 22, 24 of the first set of trim capacitors is associated with the primary capacitor 14 and may be connected in parallel with the primary capacitor 14 or to GND through the switches 48, 50, and 52, respectively. Similarly, each of the trim capacitors 26, 28, 30 and 32 is associated with the primary capacitor 16 and may be connected in parallel with the primary capacitor 16 or to GND through the switches 54, 56, 58, and 60, respectively. In the same manner, each of the trim capacitors 34, 36, 38, 40, and 42 is associated with the primary capacitor 18 and may be connected either in parallel with the primary capacitor 18 or to GND through the switches 62, 64, 66, 68, and 70, respectively.

The positive input of the voltage comparator 12 is connected to GND and the negative input is connected to the floating node 44. The voltage comparator 12 provides a RESULT OUTPUT. The RESULT OUTPUT may be connected to the floating node 44 through a switch 72.

The capacitance resulting from the parallel combination of the primary capacitor 14 and its associated first set of trim capacitors may be connected through a main switch 74 to either the reference voltage VREF or to GND. Similarly, the capacitance resulting from the parallel combination of the primary capacitor 16 and its associated second set of trim capacitors may be connected through the main switch 76 to either the reference voltage VREF or to GND; and the capacitance resulting from the parallel combination of the primary capacitor 18 and its associated third set of trim capacitors may be connected through a main switch 78 to either the reference voltage VREF or to GND.

The objective with the example circuit of FIG. 1A is to form a binarily-weighted sequence of capacitance values wherein the resultant capacitance associated with the primary capacitor 14 is one-half that of the resultant capacitance associated with the primary capacitor 16, and is one fourth that of the resultant capacitance associated with the primary capacitor 18.

By design, nominal target capacitance values must be selected for each of the capacitors of the circuit 10 which are compatible with the objective of forming a binarily-weighted sequence of values. First, a convenient nominal target value for the reference capacitor CREF is selected. For convenient implementation in an MOS monolithic integrated circuit the nominal target value for the reference capacitor CREF may, for example, be 1.0 pF. The primary capacitor 14 is designed to have a nominal capacitance of approximately ninety-five percent that of the reference capacitor CREF.

The first set to trim capacitors 20, 22, 24, is designed to have a nominal adjustable range of capacitance values of approximately ten percent that of the primary capacitor 14. The trim capacitors 20, 22, and 24 may be designed to have nominal capacitance values which form a binarily-weighted series of values, may be designed to be equal to each other in capacitance, or may be designed to have nominal capacitance values which form a series of values wherein each value is in the non-inclusive range of between one-half to one times the preceding value.

Similarly, the primary capacitor 16 may be designed to have a nominal capacitance value which is approximately ninety-five percent that of an indeal capacitance in an uncalibrated circuit. For the example of 1.0 pF for the reference capacitor CREF, the ideal final resultant capacitance associated with the primary capacitor 14 is 1.0 pF and the ideal final resultant capacitance associated with the primary capacitor 16 is 2.0 pF.

The second set of trim capacitors 26, 28, 30, 32, is designed to have a nominal adjustable range of approximately ten percent of such the ideal final resultant capacitance value associated with the primary capacitor 16.

In the same fashion, the primary capacitor 18 is designed to have a nominal capacitance of approximately ninety-five percent of the ideal binarily-weighted final resultant capacitance value (4.0 pF for the given example), and its associated third set of trim capacitors 34, 36, 38, 40 and 42 are designed to provide a nominal capacitance trimming range of approximately ten percent that of such ideal value.

In the same manner as for the first set of the trim capacitors, the second set of trim capacitors and the third set of trim capacitors may each be comprised of capacitors which by design nominally form a binarily-weighted series of values, may form a series of values wherein each value is in the non-inclusive range of between one-half to one times the preceding value, or may be designed to have equal capacitance values.

Referring now to FIG. 1B, an MOS implementation of the switches of FIG. 1A is illustrated. The voltage comparator 12 and each of the capacitors of the circuit 10 may readily and conveniently be implemented with presently-existing MOS processing technology for integration into a monolithic integrated circuit.

Figure 2:
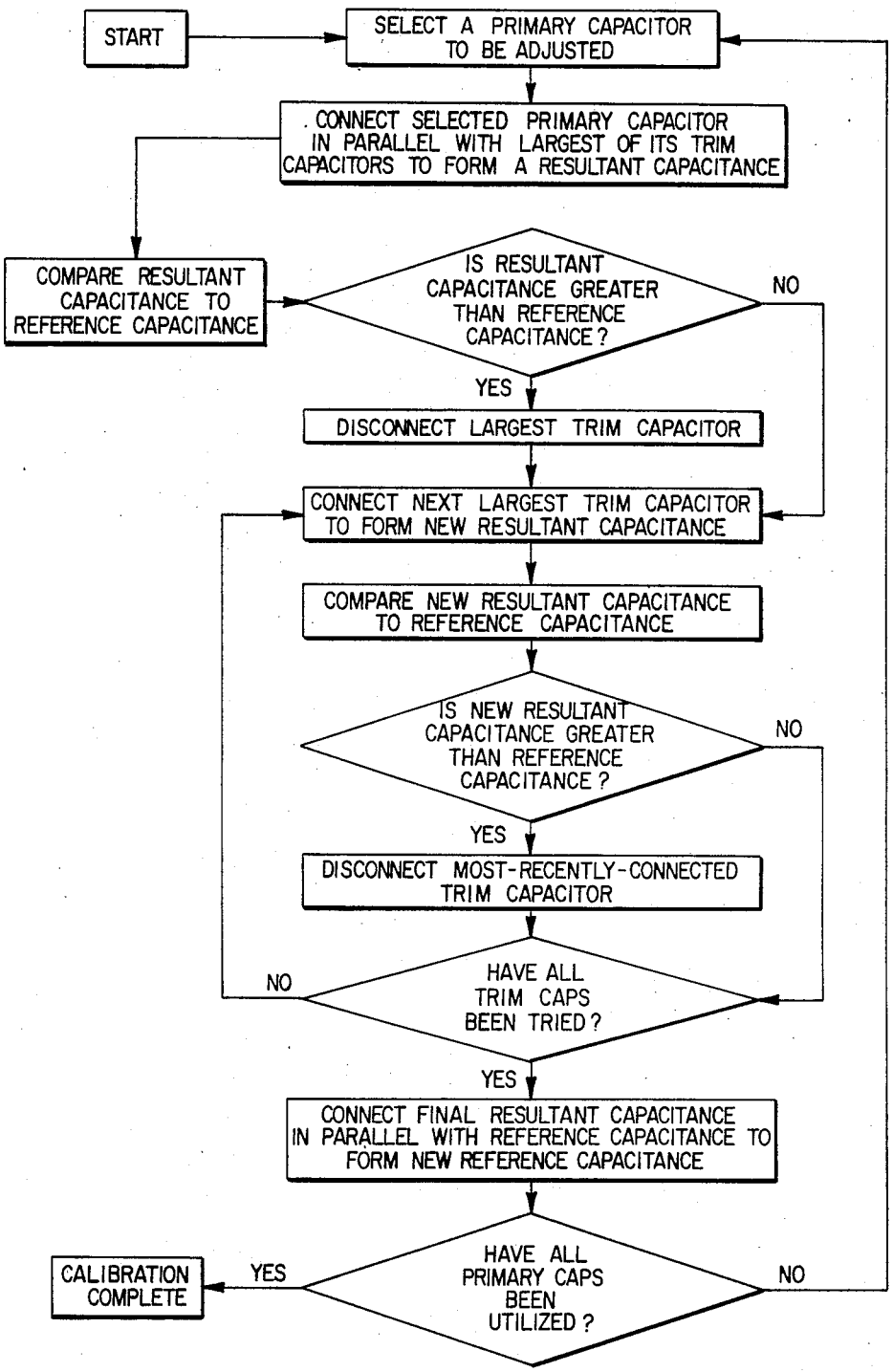
FIG. 2 is a flow chart illustrating a method in accordance with the present invention for adjusting a plurality of capacitances to form approximately a binarily-weighted sequence of values.

Referring now to FIG. 2, a procedure for adjusting the capacitances of the circuit 10 will be described. First that primary capacitor which by design is slightly smaller in capacitance than the reference capacitor CREF is selected to be adjusted. In the circuit 10, such capacitor is the primary capacitor 14. The selected primary capacitor is connected in parallel with the largest of its associated set of trim capacitors to form a resultant capacitance. Next, the value of this resultant capacitance is compared to the reference capacitance.

Figure 3B:
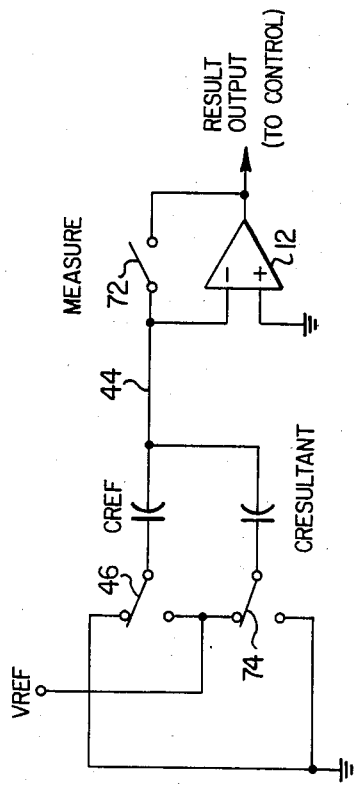
FIGS. 3A and 3B are electrical schematic diagrams which illustrate a method of determining whether one capacitance is larger or smaller than another.
Figure 3A:
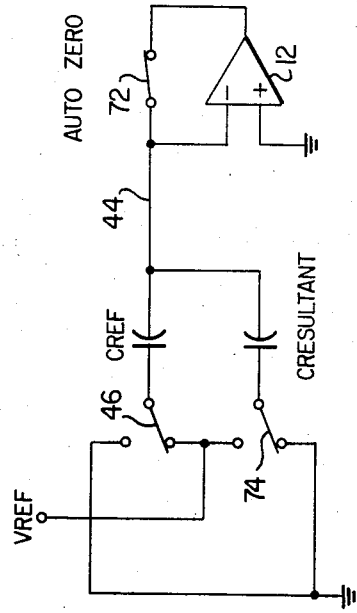

A simple means for comparing the reference capacitance to the resultant capacitance is illustrated in FIGS. 3A and 3B. As shown in FIG. 3A, with the switch 72 closed, one terminal of the reference capacitor CREF is connected to the reference voltage VREF while one terminal of the resultant capacitance CRESULTANT is connected to GND. The voltage comparator 12 causes the floating node 44 to be at a virtual ground potential. Accordingly, the reference capacitor CREF is charged to the reference voltage VREF and the resultant capacitance CRESULTANT is charged to GND. The next step in comparing the capacitances is illustrated in FIG. 3B. First, the switch 72 is opened. Next, the reference capacitor CREF is connected to GND while the resultant capacitance CRESULTANT is connected to the voltage reference VREF. Assuming that the voltage reference VREF is a positive voltage, the floating node 44 will go to a voltage more positive than GND if the resultant capacitance CRESULTANT is greater than that of the reference capacitor CREF. Conversely, the floating node 44 will transition to a voltage more negative than CND if the capacitance of the reference capacitor CREF is greater than that of the resultant capacitance CRESULTANT. The voltage comparator 12 provides for the RESULT OUTPUT either a logic 0 or a logic 1 depending upon which capacitance is the greater.

With reference again to FIG. 2, if the resultant capacitance is greater than the reference capacitance, then the largest trim capacitor is disconnected. If the resultant capacitance was not greater than the reference capacitance, the largest trim capacitor is kept connected in parallel with its associated primary capacitor. In either case, the next step is to connect the next-largest trim capacitor of the first set of trim capacitors in order to form a new resultant capacitance. In the same manner as before, the new resultant capacitance is compared to the reference capacitance; and, if the new resultant capacitance is greater than the reference capacitance, this most-recently-connected trim capacitor is disconnected, but otherwise is kept connected in parallel with the first primary capacitor. This process of connecting the next-largest trim capacitor is repeated until the smallest trim capacitor has been tried. By utilizing a sufficient number of trim capacitors, the final resultant trimmed capacitance associated with the primary capacitor 14 can be made to be almost precisely equal to the capacitance of the reference capacitor CREF.

After the final resultant capacitance associated with the primary capacitor 14 has been determined, that capacitance is connected in parallel with the reference capacitor CREF to form a new reference capacitance which has a value of almost precisely two times that of the reference capacitor CREF. In order to connect the final resultant capacitance associated with the primary capacitor 14 in parallel with the reference capacitor CREF, it is only necessary that the switches 74 and 46 be simultaneously switched to the same voltages.

The new reference capacitance is then utilized as the reference for trimming the resultant capacitance associated with the next-largest primary capacitor, which—in the circuit 10—is the primary capacitor, 16. When the above-described procedure is repeated for the primary capacitor 16 and its set of trim capacitors, a final resultant capacitance associated with the capacitor 16 is obtained which has a value of almost exactly two times that of the final resultant capacitance associated with the primary capacitor 14.

The above-described procedure is repeated, one trim capacitor at a time, until all primary capacitors have been trimmed. At that point the calibration procedure is complete. Although the circuit 10 includes only three primary capacitors for providing three binarily-weighted values, it should be understood that the circuit may be extended to larger binarily-weighted sequences.

Figure 4:
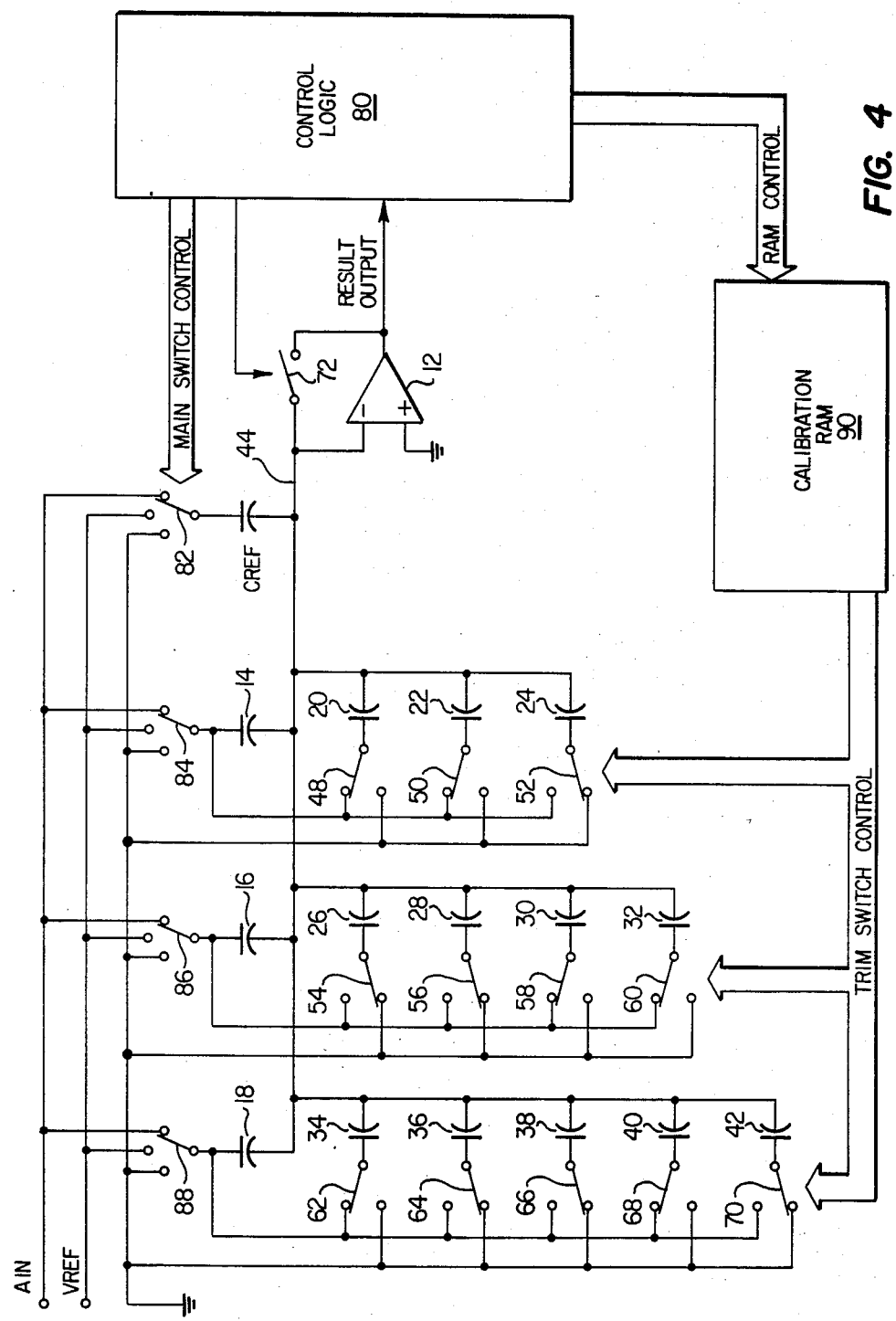
FIG. 4 is an electrical schematic diagram illustrating a portion of an analog-to-digital converter which utilizes self-calibration circuitry in accordance with the present invention.

Referring now to FIG. 4, there is illustrated a portion of an analog-to-digital converter which may be operated in accordance with the method described in conjunction with FIG. 2. The analog-to-digital converter includes an analog input node designated as AIN, control logic 80, main switches 82, 84, 86 and 88, and a calibration RAM 90.

The control logic 80 receives the RESULT OUTPUT from the voltage comparator 12 and provides control signals to the main switches, to the switch 72, and to the CALIBRATION RAM 90.

For self-calibration, the control logic 80 causes the switches to operate in accordance with the method illustrated in FIG. 2. In accordance with the foregoing description, calibration comprises a multi-step procedure wherein a keep or drop decision is made sequentially for each trim capacitor. It is convenient to regard each of these keep or drop decisions as a separate capacitance-adjustment step of a multi-step calibration procedure. The control logic 80 provides RAM CONTROL signals to the CALIBRATION RAM 90 for storing information as to whether a particular trim capacitor is connected in parallel with its associated primary capacitor. The calibration RAM 90 provides TRIM SWITCH CONTROL signals, one for each trim capacitor, for proper configuration of the trim capacitors.

The control logic 80 also provides MAIN SWITCH CONTROL signals for operation of the main switches 82, 84, 86, and 88.

Figure 5:
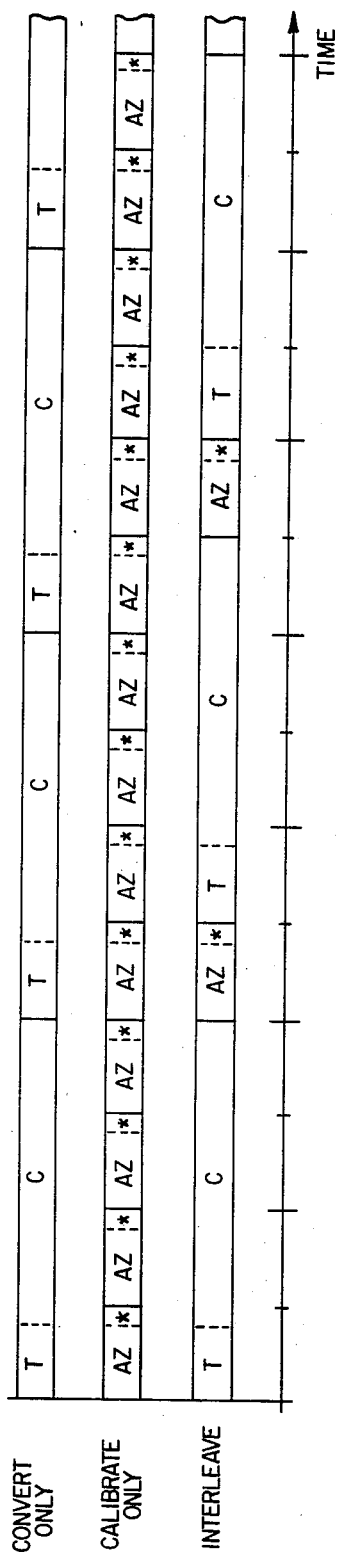
FIG. 5 is a timing diagram illustrating a method in accordance with the present invention for interleaved calibration of the capaciator array in the analog-to-digital converter of FIG. 4.

The operation of the analog-to-digital circuitry of FIG. 4 in three different modes is next described in connection with FIG. 5. The top time bar in FIG. 5 illustrates operation of the analog-to-digital converter while only performing analog-to-digital conversions. A complete conversion cycle requires two operations, designated herein as T for TRACK and C for CONVERT. During TRACK, the switch 72 on the voltage comparator 12 is closed, causing a virtual GND to be established on the floating node 44. The switchable terminal of each primary capacitor in the capacitor array is connected to the analog input AIN through the main switches 84, 86, and 88. The capacitor CREF is likewise connected to the analog input AIN through the main switch 82. During the CONVERT portion of the cycle, the switch 72 is opened and in a conventional manner for a successive approximation analog-to-digital converter, the circuit generates a digital code that is representative of the analog input signal. The binarily-weighted sequence of capacitance values must be extremely precise to provide the required precision over the entire range of analog input voltages.

The second time bar of FIG. 5 illustrates operation in a calibrate-only mode. The decision of whether to keep or drop a particular trim capacitor may be regarded as a step comprising an AUTO ZERO operation, designated herein by AZ, followed by a MEASURE operation, designated herein by a star symbol. For a large capacitance array, such as is necessary for a precision analog-to-digital converter having more than 14 bits, many such steps are required—one for each trim capacitor included in the array.

The third time bar of FIG. 5 illustrates an interleaved mode wherein conversion cycles and single calibration capacitance-adjustment steps are interleaved in a manner that causes the calibration procedure to be continuous and transparent to the user. In this interleaved mode, the separate capacitance-adjustment steps of the calibration procedure are interleaved with analog-to-digital conversion cycles. For such operation it is preferable that the CALIBRATION RAM 90 have sufficient storage to store two complete sets of information: one set comprising the information from the most recently fully-completed calibration operation, and the other set of information being that which is for the calibration which is under way.

A calibration method for capacitors in an integrated circuit and the application of such method in an analog-to-digital converter should be readily understood from the foregoing description. It should be apparent that various changes may be made in the present invention without departing from the spirit and scope of the invention.

What is claimed is:

1. A method for adjusting a plurality of capacitances in a monolithic integrated circuit wherein it is desirable that said plurality of capacitances form a binarily-weighted sequence of values, said monolithic integrated circuit including a voltage comparator, a switch connected between the output and inverting input of said voltage comparator, a reference capacitive element having a reference capacitance, a set of primary capacitors, and a plurality of sets of trim capacitors, each of said sets of trim capacitors being associated with a separate one of said primary capacitors, said reference capacitive element and each of said primary capacitors having a first terminal coupled to the inverting input of said voltage comparator, comprising:

a. connecting one primary capacitor of said set of primary capacitors in parallel with one trim capacitor of said primary capacitor's associated set of trim capacitors to thereby form a resultant capacitive element having a resultant capacitance;

b. determining whether the value of said resultant capacitance is larger or smaller than that of said reference capacitance by;

(i) causing the said switch between the output and inverting input of said voltage comparator to be a low impedance while connecting the second terminal of said reference capacitive element to a first reference voltage and while connecting the second terminal of said resultant capacitive element to a second reference voltage; then (ii) causing the said switch between the output and inverting input of said voltage comparator to be a high impedance; then (iii) connecting the second terminal of said reference capacitive element to said second reference voltage, and connecting the second terminal of said resultant capacitive element to said first reference voltage; then (iv) monitoring the output of said voltage comparator, the output voltage of said output being indicative of whether the value of said resultant capacitance is larger or smaller than that of said reference capacitance;

c. disconnecting said trim capacitor from said primary capacitor if the value of said resultant capacitance is greater than that of said reference capacitance;

d. connecting another trim capacitor of said associated set of trim capacitors in parallel with said primary capacitor to thereby form a new resultant capacitance to replace said resultant capacitance;

e. determining whether the value of said new resultant capacitance is larger or smaller than that of said reference capacitance by the procedure of step b, (i) through (iv);

f. disconnecting said other trim capacitor from said primary capacitor if the value of said new resultant capacitance is greater than that of said reference capacitance;

g. repeating steps d through f until each trim capacitor of said associated set of trim capacitors has been connected in parallel with said primary capacitor and a determination has been made whether to subsequently disconnect each such trim capacitor from said primary capacitor, whereby a final resultant capacitance is formed that includes the capacitance of said primary capacitor;

h. connecting said final resultant capacitance in parallel with said reference capacitance to form a new reference capacitance; and i. repeating steps a through h with a different primary capacitor until all primary capacitors have been utilized.

2. A method according to claim 1 wherein:

a. each of the sets of said trim capacitors comprises a plurality of capacitors, the capacitance values of which form a series of values wherein each value is in the non-inclusive range of between one-half to one times the preceding value; and, b. the trim capacitors are connected to their associated primary capacitor in the order of largest to smallest capacitance.

3. A method according to claim 1 wherein:

a. each of the sets of said trim capacitors comprises a plurality of capacitors, the capacitance values of which form a binarily-weighted series of values; and, b. the said trim capacitors are connected to their associated primary capacitor in order of largest to smallest capacitance.

4. A method of interleaved operation and calibration of an analog-to-digital converter of the successive approximation charge redistribution type, said analog-to-digital converter including a set of primary capacitors and at least one set of trim capacitors individually connectable to one of said primary capacitors, comprising:

a. determining whether a preselected one of said trim capacitors should be connected in parallel with said primary capacitor for calibrating the capacitance of said primary capacitor, and connecting or not connecting said trim capacitor accordingly; then b. generating a digital code representative of an analog input signal by performing an analog-to-digital conversion cycle; and c. repeating steps a and b for a different preselected one of said trim capacitors until a connect or not connect determination has been made for each of said trim capacitors.

* * * * *